US011727258B2

(12) United States Patent
Obradovic et al.

(10) Patent No.: US 11,727,258 B2
(45) Date of Patent: *Aug. 15, 2023

(54) MULTI-BIT, SOC-COMPATIBLE NEUROMORPHIC WEIGHT CELL USING FERROELECTRIC FETS

(71) Applicant: Samsung Electronics Co., Ltd., Suwon-si (KR)

(72) Inventors: Borna J. Obradovic, Leander, TX (US); Titash Rakshit, Austin, TX (US); Rwik Sengupta, Austin, TX (US); Joon Goo Hong, Austin, TX (US); Ryan M. Hatcher, Austin, TX (US); Jorge A. Kittl, Austin, TX (US); Mark S. Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/939,807

(22) Filed: Sep. 7, 2022

(65) Prior Publication Data
US 2023/0004789 A1    Jan. 5, 2023

Related U.S. Application Data

(63) Continuation of application No. 15/806,259, filed on Nov. 7, 2017, now Pat. No. 11,461,620.

(Continued)

(51) Int. Cl.
*G06N 3/063* (2023.01)
*H01L 29/423* (2006.01)
(Continued)

(52) U.S. Cl.
CPC ........ *G06N 3/063* (2013.01); *H01L 29/40111* (2019.08); *H01L 29/42392* (2013.01); *H01L 29/785* (2013.01); *H01L 29/78391* (2014.09)

(58) Field of Classification Search
CPC . G06N 3/063; G11C 11/5657; G11C 11/2275; H01L 29/40111; H01L 29/42392; H01L 29/78391; H01L 29/785
See application file for complete search history.

(56) References Cited

U.S. PATENT DOCUMENTS 4,873,455 A     10/1989   de Chambost et al.
6,844,582 B2    1/2005    Ueda et al.
(Continued)

FOREIGN PATENT DOCUMENTS

CN          105609503 A       5/2016
KR      10-2013-0021884 A     3/2013
WO      WO 2018/007783 A1     1/2018

OTHER PUBLICATIONS

Florent, Karine, "Ferroelectric HfO2 for Emerging Ferroelectric Semiconductor Devices"; Thesis: Rochester Institute of Technology, https://scholarworks.rit.edu/viewcontent.cgi?article=10042 &context=theses, Nov. 11, 2015 (133 pages).

(Continued)

*Primary Examiner* — Seokjin Kim
(74) *Attorney, Agent, or Firm* — Lewis Roca Rothgerber Christie LLP

(57) ABSTRACT

A neuromorphic multi-bit digital weight cell configured to store a series of potential weights for a neuron in an artificial neural network. The neuromorphic multi-bit digital weight cell includes a parallel cell including a series of passive resistors in parallel and a series of gating transistors. Each gating transistor of the series of gating transistors is in series with one passive resistor of the series of passive resistors. The neuromorphic cell also includes a series of programming input lines connected to the series of gating transistors, an input terminal connected to the parallel cell, and an output terminal connected to the parallel cell.

18 Claims, 7 Drawing Sheets
(6 of 7 Drawing Sheet(s) Filed in Color)

Related U.S. Application Data

(60) Provisional application No. 62/528,856, filed on Jul. 5, 2017.

(51) Int. Cl.
  *H01L 29/78* (2006.01)
  *H01L 21/28* (2006.01)

(56) References Cited

U.S. PATENT DOCUMENTS

| | | | |
|---|---|---|---|
| 7,173,310 B2* | 2/2007 | Voidman | H01L 27/0248 |
| | | | 257/536 |
| 8,164,941 B2 | 4/2012 | Kang et al. | |
| 9,852,790 B1* | 12/2017 | Gokmen | G11C 13/0038 |
| 10,079,229 B1* | 9/2018 | Bi | H01L 29/7851 |
| 11,461,620 B2* | 10/2022 | Obradovic | G06N 3/063 |
| 2002/0185690 A1 | 12/2002 | Ueda et al. | |
| 2003/0142533 A1* | 7/2003 | Ueda | G11C 11/54 |
| | | | 257/E29.302 |
| 2011/0119215 A1* | 5/2011 | Elmegreen | G06N 3/065 |
| | | | 706/37 |
| 2014/0183640 A1 | 7/2014 | Erickson et al. | |
| 2015/0039547 A1 | 2/2015 | Kang et al. | |
| 2016/0004960 A1 | 1/2016 | Saïghi et al. | |
| 2016/0048755 A1 | 2/2016 | Freyman et al. | |
| 2018/0174034 A1 | 6/2018 | Obradovic et al. | |
| 2018/0300618 A1 | 10/2018 | Obradovic et al. | |
| 2019/0012593 A1* | 1/2019 | Obradovic | G06N 3/063 |
| 2019/0236445 A1* | 8/2019 | Das | G06N 3/065 |

OTHER PUBLICATIONS

Nawrocki, Robert A., et al., "A Neuromorphic Architecture From Single Transistor Neurons With Organic Bistable Devices for Weights," Proceedings of the International Joint Conference on Neural Networks, 2011, IEEE, 7 pages.

Korean Office Action dated Oct. 26, 2021, issued in corresponding Korean Patent Application No. 10-2018-0001687 (3 pages).

* cited by examiner

MULTI-BIT, SOC-COMPATIBLE NEUROMORPHIC WEIGHT CELL USING FERROELECTRIC FETS

CROSS-REFERENCE TO RELATED APPLICATION(S)

This application is a continuation of U.S. patent application Ser. No. 15/806,259, filed Nov. 7, 2017, which claims priority to and the benefit of U.S. Provisional Application No. 62/528,856 entitled "Multi-Bit, SoC-Compatible Neuromorphic Weight Cell Using Ferroelectric FETs," filed Jul. 5, 2017, the entire contents of both of which are incorporated herein by reference.

FIELD

The present application relates generally to the storage of weights for neurons in artificial neural networks.

BACKGROUND

Applications involving deep-learning artificial neural networks (ANNs) are increasingly commonly utilized for various tasks, such as image recognition, natural language processing, and various pattern-matching and classification tasks. The ANN includes multiple layers of neurons, and the outputs of the neurons of each layer are connected to all of the neuron inputs ($x_1$-$x_n$) of the next layer. As illustrated in FIG. 1, each connection between the neurons has a "weight" ($w_{1j}$-$w_{nj}$) associated with it. The activation of each neuron is computed by performing a weighted sum of the inputs ($x_1$-$x_n$) to the neurons and transferring the linear combination of the weighted inputs into a thresholding activation function (f(S)) with a transfer function. That is, the essential computational element of the ANN performs a multiplication of a set of input signals by a set of weights, followed by a summation (e.g., a linear combination of input signals), which is then thresholded by a comparator.

Analog neurons have been proposed as a fast and energetically efficient way of performing the multiply-and-add operation performed in ANNs. Storing the weights locally (i.e., local to the neuron-neuron interconnections) is important to performing to the multiply-and-add operations of the ANNs efficiently. Some related art systems utilize analog memory elements for the storage of the neuron weights, with the conductance of the analog memory element representing the weight. The higher the conductance, the higher the weight and therefore the greater the influence of the neuron input which utilizes that conductance. However, analog weights present significant hardware design challenges because analog weights are difficult to program precisely, due in part to the non-linear nature of the non-volatile memory (NVM) elements typically utilized, such as flash, phase-change memory (PCM), oxide-based resistive memory (OxRAM), conductive bridging RAM (CBRAM), or memresistors. Additionally, process variation in the NVM elements or the programming circuitry means that each element must be programmed in a feedback loop that senses the level of programming (i.e., the weight). Accordingly, a complex iterative algorithm must be implemented on-chip if analog weights are utilized, which results in a significant increase in circuit complexity, size, and energy requirements.

Additionally, some related art memory cells include NVM elements in series with the passive resistor elements to activate and deactivate current paths through passive resistors. However, providing the NVM elements in series with the passive resistor elements results in a uniform distribution of quantized resistances (i.e., inverse weights), and therefore a non-uniform distribution of weights. For instance, some related art memory cells including NVM elements in series with the passive resistive elements may be biased to produce more weights near zero. Furthermore, such related art memory cells may be suitable for high-density integration in a V-NAND process, but less suitable for integration with a system on chip (SoC) CMOS process.

SUMMARY

The present disclosure is directed to various embodiments of a neuromorphic multi-bit digital weight cell configured to store a series of potential weights for a neuron in an artificial neural network (ANN). In one embodiment, the neuromorphic weight cell includes a parallel cell including a series of passive resistors in parallel and a series of gating transistors. Each gating transistor of the series of gating transistors is in series with one passive resistor of the series of passive resistors. The neuromorphic weight cell also includes a series of programming input lines connected to the series of gating transistors, an input terminal connected to the parallel cell, and an output terminal connected to the parallel cell.

A first passive resistor of the series of passive resistors may have a first resistance and a second passive resistor of the series of passive resistors may have a second resistance that is half of the first resistance. A third passive resistor of the series of passive resistors may have a third resistance that is half of the second resistance.

The neuromorphic weight cell may have a total conductance defined by $G_{tot}=\Sigma_{i=0} b_i 2^i G_0$, where $b_i$ is a Boolean value of bit i and $G_0$ is a smallest conductance in the neuromorphic weight cell.

The neuromorphic weight cell may be configured to generate a series of potential conductances uniformly distributed, and the potential weights are proportional to the potential conductances.

Each passive resistor of the series of passive resistors may be an un-gated FinFET having an n-doped channel and n+ doped source and drain regions. A doping concentration of each of the un-gated FinFETs may be between approximately $10^{18}$ cm$^{-3}$ and approximately $10^{19}$ cm$^{-3}$, and each of the un-gated FinFETs may be doped with As or P doping. A channel length of each of the un-gated FinFETs may be approximately 30 nm, and a doping concentration of each of the un-gated FinFETs may be approximately $6*10^{18}$ cm$^{-3}$. An overall length of each of the un-gated FinFETs may span more than one contacted poly pitch (CPP). Each passive resistor of the series of passive resistors my include a series of un-gated FinFETs. Each gating transistor of the series of gating transistors may be a standard core logic transistor. The standard core logic transistor may be a FinFET or a GAA FET.

Each gating transistor of the series of gating transistors may be a ferroelectric FET (FeFET). The FeFET includes a ferroelectric capacitor (FeCap) and an underlying FET. The FeCap is connected to a gate of the underlying FET. The FeCap may include a pair of titanium nitride (TiN) electrodes and a hafnium zirconium oxide (HfZrO$_2$) ferroelectric layer between the pair of TiN electrodes. The FeCap of each FeFET may be at a metal layer in a back-end-of-line of the neuromorphic weight cell. The metal layer may be lowermost metal routing layer M0. The FeCap of each FeFET may be at an insulating layer in a back-end-of-line of the neuromorphic weight cell. The insulating layer may be lowermost insulating layer V0.

The neuromorphic weight cell may also include a selector line connected to the series of programming input lines, and a series of selector transistors at junctions between the selector line and the series of programming input lines.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale. Additionally, the patent or application file contains at least one drawing executed in color. Copies of this patent or patent application publication with color drawing(s) will be provided by the Office upon request and payment of the necessary fee.

DETAILED DESCRIPTION

Figure 1:
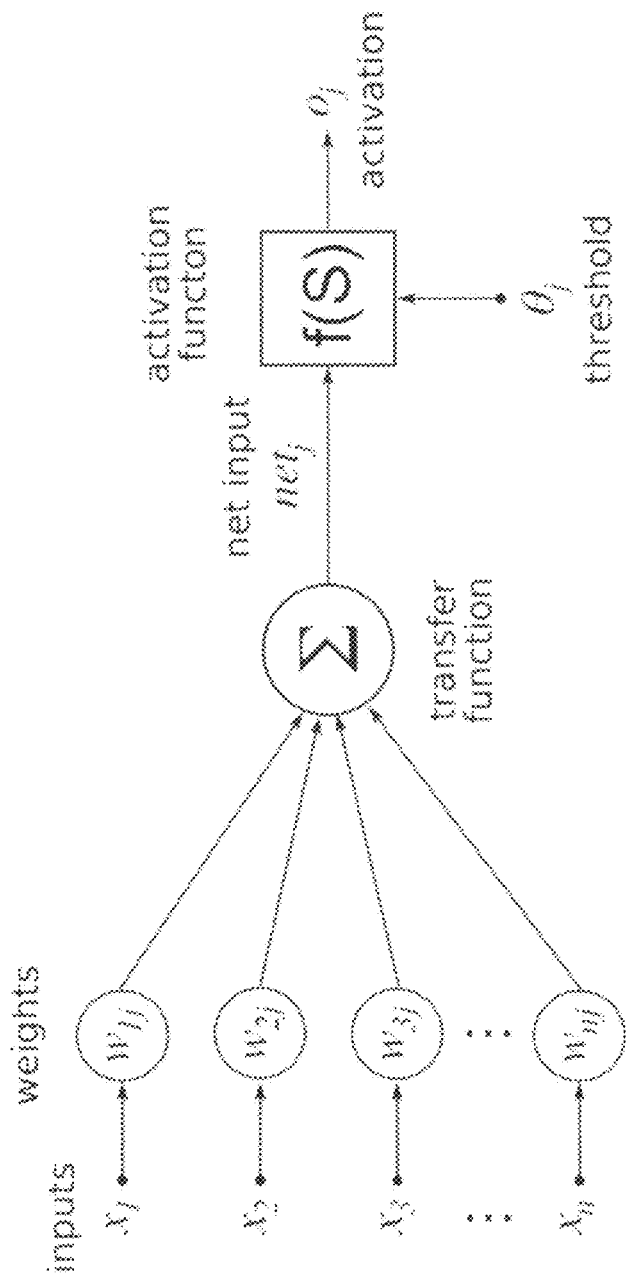
FIG. 1 is a schematic view of a neuron in an artificial neural network (ANN)

The present disclosure is directed to various embodiments of a neuromorphic multi-bit digital weight cell configured to store a series of potential weights for neurons in an artificial neural network (ANN). The neuromorphic cells of the present disclosure utilize non-volatile memory (NWM) elements in series with passive resistors to activate and deactivate current paths through the passive resistors. Providing the NVM elements in series with the passive resistors results in a uniform distribution of the weights (i.e., a uniform distribution of conductances which are utilized to represent the weights), which results in better accuracy and a smaller number of neurons needed to achieve the same accuracy compared to neuromorphic cells with a non-uniform distribution of weights. In one or more embodiments, the neuromorphic cells may store the weights as the states of a ferroelectric capacitor (FeCap), which enables non-volatile storage. The multi-bit digital representation of the weights provided by the neuromorphic cells of the present disclosure enable ANN training (i.e., ANN learning) to be performed off-chip and enables the exact weights to be transferred accurately to the multi-bit digital network. Additionally, storing multiple bits enables a wider range of possible neural nets to be implemented compared to storing a single bit. Furthermore, the neuromorphic cells of the present disclosure are suitable for integration with a system on chip (SoC) CMOS process.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2A:
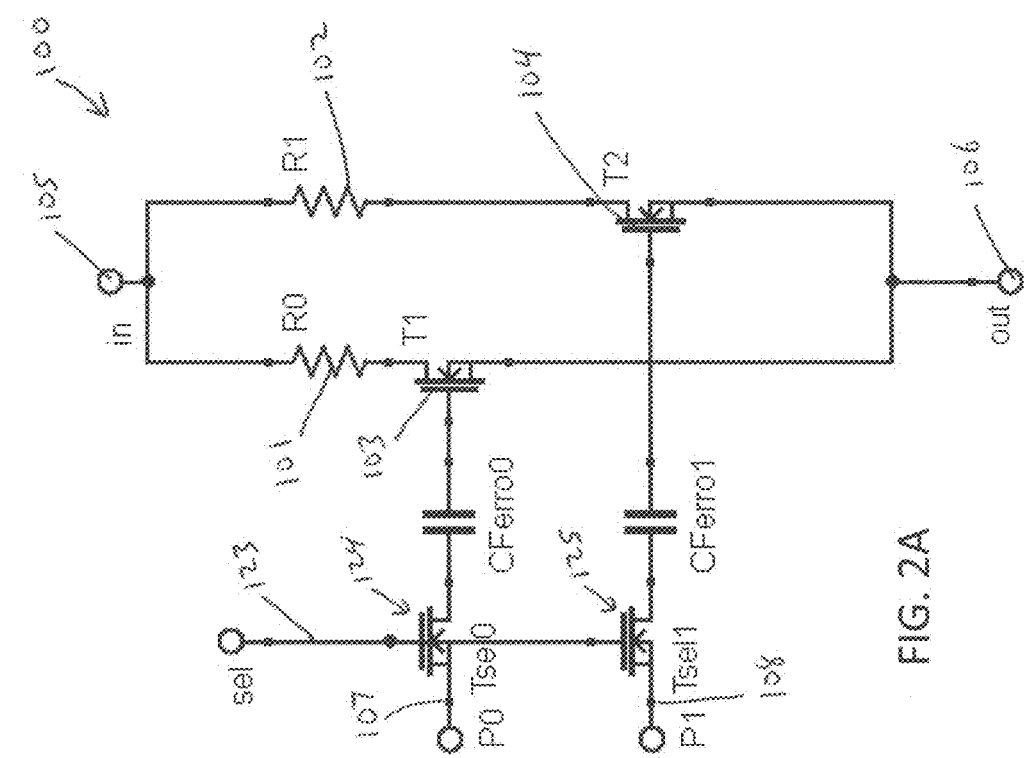
FIG. 2A is a schematic view of a neuromorphic cell according to one embodiment of the present disclosure including a plurality of passive resistors arranged in parallel and a plurality of gating transistors in series with the plurality of passive resistors.
Figure 2B:
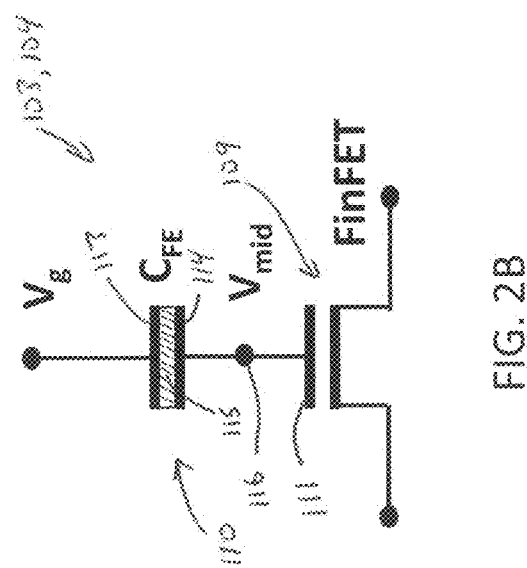
FIG. 2B is a detailed view of gating transistor including a ferroelectric field effect transistor (FeFET) according to one embodiment of the present disclosure.

With reference now to FIG. 2A, a neuromorphic cell 100 according to one embodiment of the present disclosure includes a plurality of passive resistors 101, 102 arranged in parallel, and a plurality of gating transistors 103, 104 arranged in series with the resistors 101, 102, respectively (e.g., the first gating transistor 103 is in series with the first passive resistor 101, and the second gating transistor 104 is in series with the second passive resistor 102). Together, the passive resistors 101, 102 and the gating transistors 103, 104 are arranged in a parallel cell. The neuromorphic cell 100 also includes an input terminal 105 and an output terminal 106 connected to the parallel cell. Additionally, in the illustrated embodiment, the neuromorphic cell 100 includes programming input lines 107, 108 connected to the gating transistors 103, 104, respectively. The programming input lines 107, 108 are configured to apply a bias voltage to the gating transistors 104, 105, 106 to turn (e.g., program) the gating transistors 104, 105, 106 into either an "ON" or "OFF" state to control (i.e., block or enable) the flow of current through selected passive resistors 101, 102 based on the desired weight of the neuromorphic cell 100.

In the illustrated embodiment, the neuromorphic cell 100 has two passive resistors 101, 102 (e.g., the parallel cell includes two branches) and therefore the neuromorphic cell 100 is configured to provide a 2-bit representation of the weight of the neuron. The 2-bit representation can provide 4 levels of weights (i.e., $2^2$ levels of weights). In one or more embodiments, the neuromorphic cell 100 may have any other suitable number passive resistors, such as, for instance, three passive resistors providing a 3-bit representation of the weight (i.e., $2^3$=8 levels of weights) or more than three resistors providing an n-bit representation of the weight (i.e., $2^n$ levels of weights).

Each passive resistor of the neuromorphic cell 100 has a resistance that is half or substantially half of the resistance of the immediately preceding passive resistor. In the illustrated embodiment, the first passive resistor 101 has a resistance $R_0$ and the second passive resistor 102 has a resistance $R_1$ that is half the resistance $R_0$ of the first passive resistor 101 (i.e., $R_1 = R_0/2$). In one embodiment in which the neuromorphic cell 100 has three passive resistors, the third resistor would have a resistance $R_2$ that is half of the resistance $R_1$ of the second passive resistor 102 and a quarter of the resistance $R_0$ of the first passive resistor 101 (i.e., $R_2 = R_1/2 = R_0/4$).

The weight stored by the neuromorphic cell 100 is proportional to the total conductance $G_{tot}$ (i.e., the inverse of the total resistance) of the neuromorphic cell 100. The total conductance $G_{tot}$ of the neuromorphic weight cell 100 is defined by $G_{tot} = \Sigma_{i=0} b_i 2^i G_0$, where $b_i$ is a Boolean value of bit i and $G_0$ is a smallest conductance in the neuromorphic weight cell 100. In the illustrated embodiment, the smallest conductance $G_0$ in the neuromorphic cell 100 is $1/R_0$ associated with the first passive resistor 101, which has the highest resistance. For instance, when the first gating transistor 103 is in the "ON" state and the second gating transistor 104 is in the "OFF" state, the Boolean value of the first bit $b_1$ (i.e., bit corresponding to the first passive resistor 101) is 1 and the Boolean value of the second bit $b_2$ (i.e., the bit corresponding to the second passive resistor 102) is 0, and therefore the total conductance $G_{tot}$ of the neuromorphic cell 100 is $1/R_0$. When the first gating transistor 103 is in the "ON" state and the second gating transistor 104 is in the "OFF" state, the Boolean value of the first bit $b_1$ (i.e., bit corresponding to the first passive resistor 101) is 0 and the Boolean value of the second bit $b_2$ (i.e., the bit corresponding to the second passive resistor 102) is 1, and therefore the total conductance $G_{tot}$ of the neuromorphic cell 100 is $2/R_0$. When the first and second transistor are in the "ON" state, the Boolean value of the first and second bits $b_1$, $b_2$ (i.e., the bits corresponding to the first and second passive resistors 101, 102) is 1, and therefore the total conductance of the neuromorphic weight cell is 3/R0. Accordingly, since the weight is proportional to the total conductance, the distribution of weights produced by the neuromorphic cell 100 is uniform (e.g., the conductances of the resistors form the base two geometric sequence G, 2G, 4G, . . . $2^{n-1}$G, where n is the number of bits of the neuromorphic cell 100), which results in better accuracy and a smaller number of neurons needed to achieve the same accuracy compared to neuromorphic cells with a non-uniform distribution of weights. In one embodiment in which a neuron with a summing amplifier utilizes a feedback resistor Rf, the weight, w, can be expressed as follows:

$$w_i = \frac{R_f}{R_i}.$$

Figure 3:
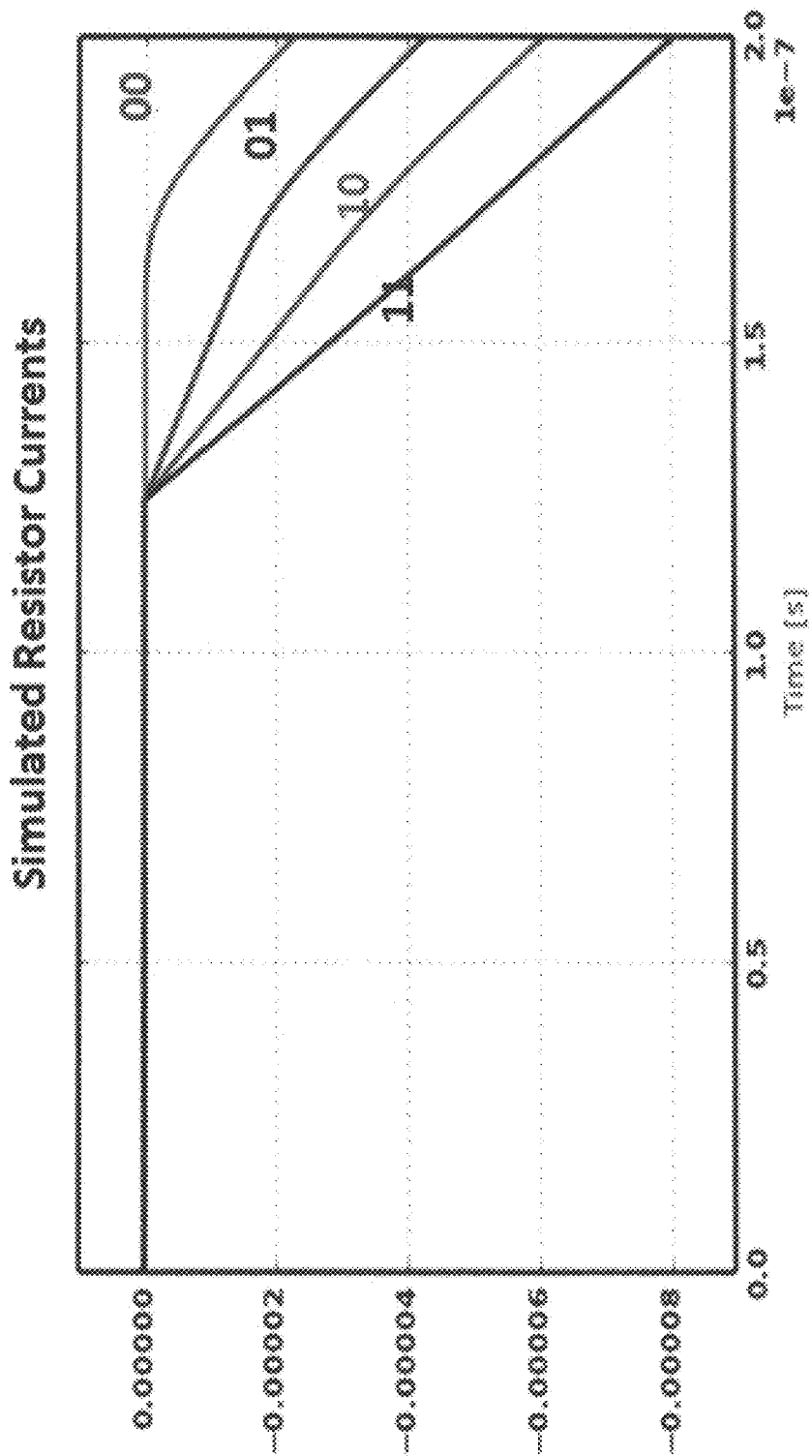
FIG. 3 is a graph depicting simulated resistor currents in various "ON"/"OFF" states for a neuromorphic cell according to one embodiment of the present disclosure.

FIG. 3 is a graph depicting the simulated currents through the passive resistors 101, 102 as a function of the programming state (i.e., "ON" or "OFF") of the gating transistors 103, 104 for a 2-bit neuromorphic cell 100 according to one or more embodiments of the present disclosure. Line "11" depicts the current level when both of the first and second gating transistors 103, 104 are in the "ON" state. Line "10" depicts the current level when the first gating transistor 103 is in the "ON" state and the second gating transistor 104 is in the "OFF" state. Line "01" depicts the current level when the first gating transistor 103 is in the "OFF" state and the second gating transistor 104 is in the "ON" state, and line "00" depicts the current level when both of the first and second gating transistors 103, 104 are in the "OFF" state.

In one or more embodiments, the gating transistors 103, 104 may be standard core logic transistors, such as a fin field effect transistor (FinFET) or a gate-all-around field effect transistor (GAA FET). In the embodiment illustrated in FIG. 2A, each gating transistor 103, 104 includes a field effect transistor (FET) 109 (e.g., a FinFET) and a ferroelectric capacitor (FeCap) 110 connected to a gate 111 of the FET 109. Together, the FeCap 110 and the underlying FET 109 form or define a ferroelectric FET (FeFET) 112. The FeCaps 110 effectively shift the threshold voltage (Vt) of the gating transistors 103, 104, making the gating transistors either "ON" or "OFF" in the presence of a zero gate bias (e.g., the FeCaps 110 store a polarization state even without an applied voltage). Accordingly, during inference (e.g., when the ANN is deployed to classify, recognize, and/or process unknown inputs), the applied gate bias through the input programming lines 107, 108 is zero and only the branches of the neuromorphic cell with the "ON" gating transistors 103, 104 are conductive.

In the illustrated embodiment, each of the FeCaps 110 includes a pair of electrodes 113, 114 and a ferroelectric layer 115 between the pair of electrodes 113, 114. The electrodes 113, 114 of the FeCaps 110 may be formed from any suitable materials or materials, such as, for instance, titanium nitride (TiN). In one or more embodiments, the ferroelectric layer 115 of the FeCaps 110 may be formed from any suitable ferroelectric material or materials, such as, for instance, hafnium zirconium oxide ($HfZrO_2$). The coercive voltage of the FeCaps 110 depends on the ferroelectric material of the ferroelectric layer 115 and the thickness of the ferroelectric layer 115. The ferroelectric layer 115 may have any suitable thickness depending on the desired capacitance and coercive voltage of the FeCaps 110. In one or more embodiments, the ferroelectric material of the FeCaps 110 may have a thickness greater than approximately 3 nm (e.g., approximately 10 nm). In one or more embodiments, the coercive voltage of the FeCaps 110 may be from approximately 0.7 V to approximately 1.0 V.

Figure 4:
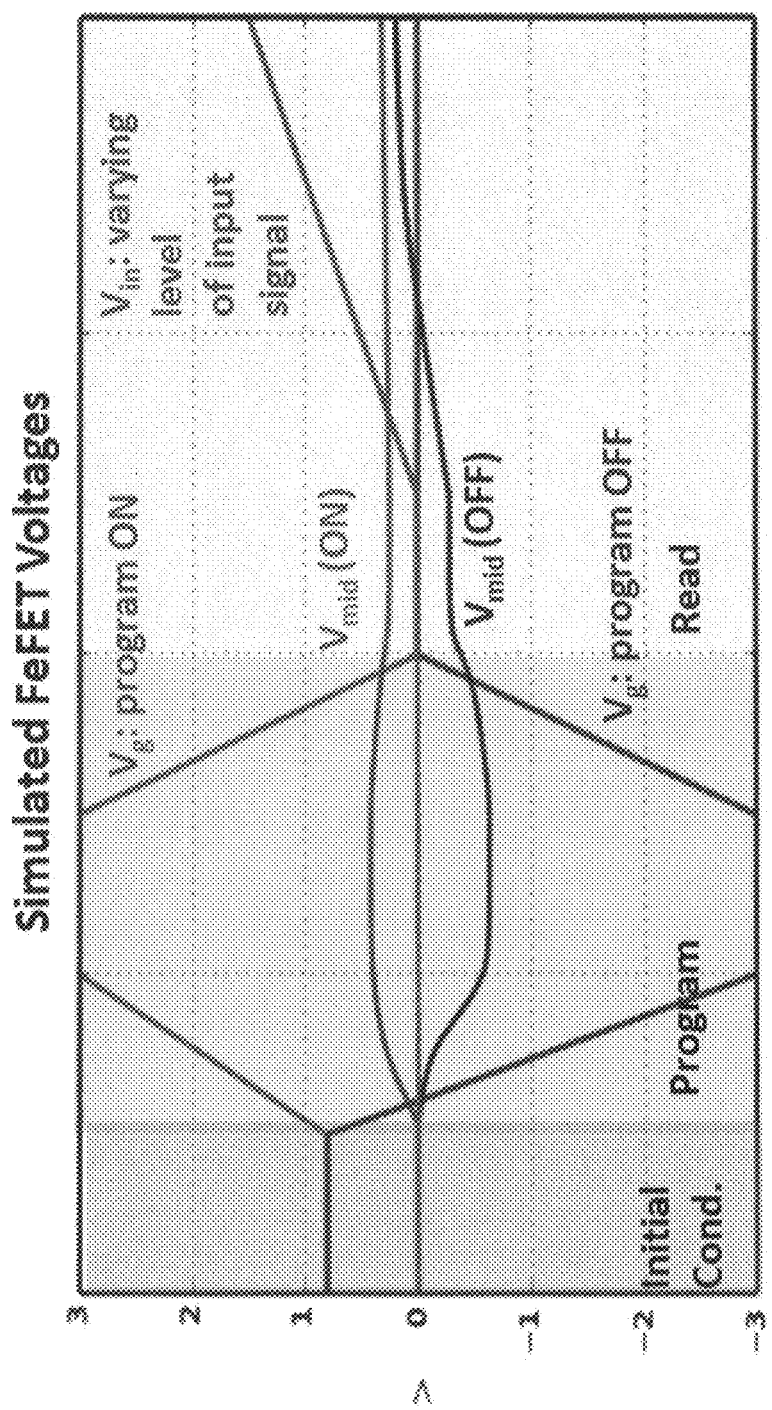
FIG. 4 is a graph depicting simulated FeFET voltages of a neuromorphic cell during programming and during a read operation according to one embodiment of the present disclosure.

In one or more embodiments, programming the FeCaps 110 of the FeFET gating transistors 103, 104 involves setting the programming input lines 107, 108 to apply either a high positive voltage to set one or more of the FeFET gating transistors 103, 104 to the "ON" state or a high negative voltage to set one or more of the FeFET gating transistors 103, 104 to the "OFF" state. FIG. 4 is a graph depicting simulated FeFET voltages showing the application of a high positive voltage to set one or more of the FeFET gating transistors 103, 104 to the "ON" state and the application of a high negative voltage to set one or more of the FeFET gating transistors 103, 104 to the "OFF" state. As illustrated in FIG. 4, when a high positive voltage is applied to one or more of the FeFET gating transistors 103, 104, the voltage at a floating node 116 connecting the FeCap 110 to the gate 111 of the underlying FET 109 is increased from 0 V to a positive voltage (e.g., approximately 300 mV), and when a high negative voltage is applied to one or more of the FeFET gating transistors 103, 104, the voltage at the floating node 116 ($V_{mid}$) is decreased from 0 V to a negative voltage (e.g., approximately −300 mV). As illustrated in FIG. 4, the FeCaps 110 exhibit hysteresis (e.g., the FeCaps 110 store a polarization state even without the application of the high positive voltage or the high negative voltage during programming). FIG. 4 also depicts a varying level of input signal (Vin) during a read operation.

In one or more embodiments, the applied bias during the programming of the FeCaps 110 is high enough to result in a voltage across the FeCaps 110 that is at least as large as the coercive voltage of the FeCaps 110 (i.e., the applied voltage is at least as large as the resistance of the ferroelectric material of the FeCaps 110 to becoming depolarized). The coercive voltage of the FeCaps 110 depends on the ferroelectric material and the thickness of the ferroelectric material. In one or more embodiments, the ferroelectric material of the FeCaps 110 may have a thickness greater than approximately 3 nm (e.g., approximately 10 nm). In one or more embodiments the coercive voltage of the FeCaps 110 may be from approximately 0.7 V to approximately 1.0 V. Given the capacitive voltage division between the FeCap 110 and the gate 111 of the underlying FET 109, in one or more embodiments, the applied bias may be approximately twice the coercive voltage. In one or more embodiments, the applied bias during programming may be lower (e.g., lower than approximately 0.7 V), but this will result in a more weakly "ON" or more weakly "OFF" gating transistor.

Figure 5:
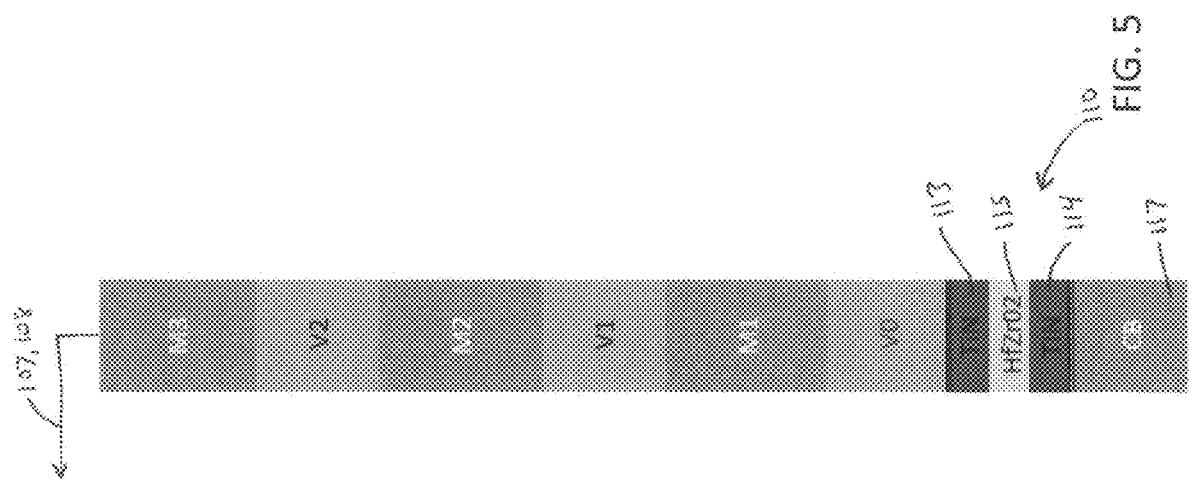
FIG. 5 is a schematic view of a ferroelectric capacitor of a FeFET at the back-end-of-line (BEOL) according to one embodiment of the present disclosure.

In one or more embodiments, the FeCaps 110 of the gating transistors 103, 104 may be at or in one of the metal layers M0-M3 (e.g., the lowermost metal routing layer M0) of the back end of line (BEOL). In the embodiment illustrated in FIG. 5, the FeCaps 110 are at the lowermost metal layer M0 of the BEOL (e.g., the pair of TiN electrodes 113, 114 and the $HfZrO_2$ ferroelectric layer 115 of the FeCaps 100 are located at the lowermost metal routing layer M0). In one or more embodiments, the FeCaps 110 of the gating transistors 103, 104 may be at or in one of the insulating layers V0-V2 (e.g., the lowermost insulating layer V0) of the BEOL. Additionally, in the embodiment illustrated in FIG. 5, the uppermost metal routing layer (e.g., metal routing layer M3) is connected to the programming lines 107, 108 and a contact bonding (CB) layer 117 below the lowermost metal layer M0 is connected to the gate 111 of the underlying FET 109 for each of the gating transistors 103, 104.

Figure 6:
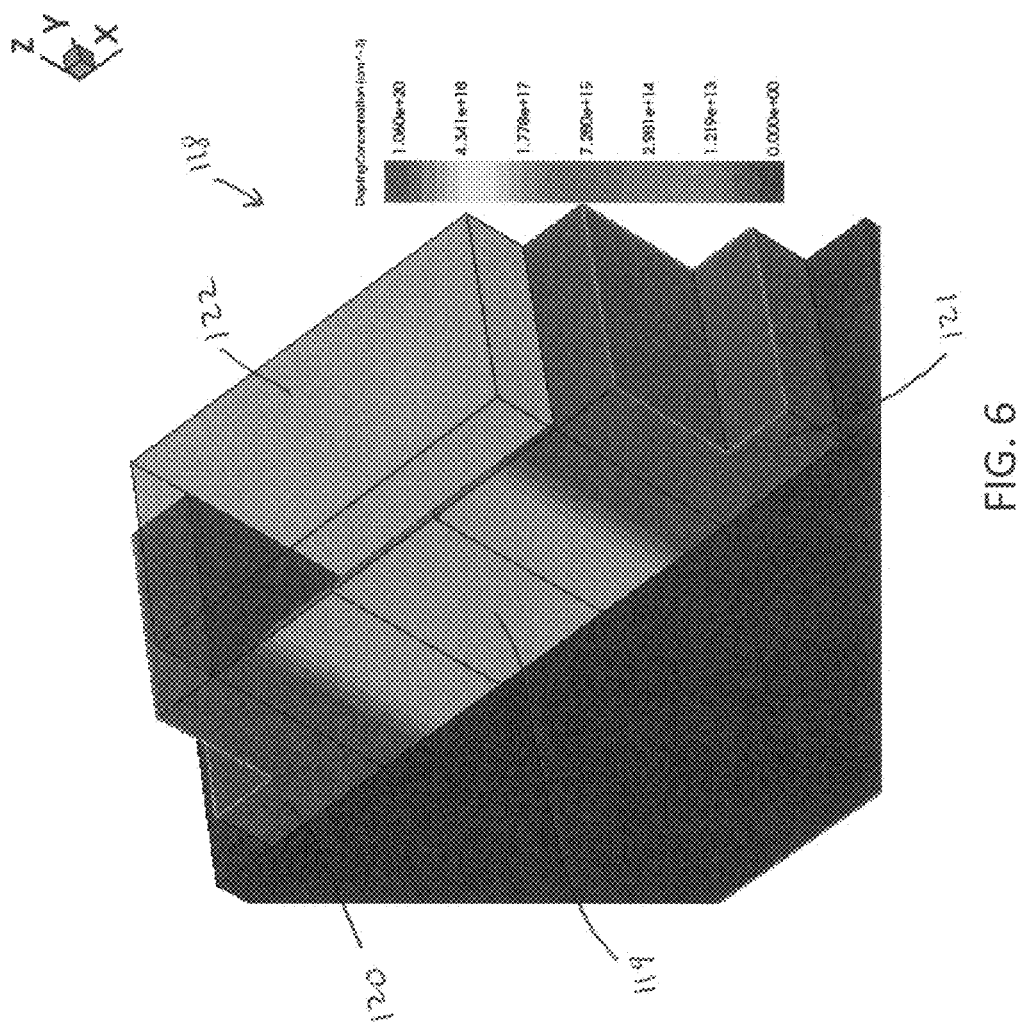
FIG. 6 is a perspective view of a passive resistor including an un-gated FinFET according to one embodiment of the present disclosure.

With reference now to FIG. 6, in one or more embodiments, each of the passive resistors 101, 102 is an un-gated FinFET 118 having an n-doped channel 119 and n+ doped source and drain regions 120, 121. Additionally, in the illustrated embodiment, each of the un-gated FinFETs 118 includes a oxide layer 122 instead of a conventional gate electrode. In one or more embodiments, a doping concentration (N) of each of the un-gated FinFETs 118 is between $10^{18}$ cm$^{-3}$ and $10^{19}$ cm$^{-3}$. In one or more embodiments, each of the un-gated FinFETs 118 may be doped with arsenic (As) or phosphorous (P). In one or more embodiments, a channel length (Lc) of the un-gated FinFET 118 may be approximately 15 nm. In one or more embodiments, the channel length (Lc) of the un-gated FinFET 118 may be approximately 30 nm. In one or more embodiments, the channel length (Lc) of each of the un-gated FinFET's 118 may be longer than a conventional core logic FinFET. In one or more embodiments, an overall length of each of the un-gated FinFETs 118 spans more than one contacted poly pitch (CPP) length. In one or more embodiments, the overall length of each of the un-gated FinFETs 118 spans two CPP length.

In one or more embodiments, each of the passive resistors 101, 102 includes a series of resistor fins (e.g., each passive resistor 101, 102 includes two or more un-gated FinFETs 118). The number of resistor fins of each passive resistor 101, 102 varies depending on the desired resistance of the passive resistors 101, 102.

The relative conductance of the un-gated FinFET 118 is defined as $$\frac{\sigma(G)}{G} = \frac{1}{\sqrt{N}}$$

where G is the conductance of the un-gated FinFETs 118 and N is the number of dopants in the channel 119. In one embodiment in which the un-gated FinFET 118 has a channel length (Lc) approximately 15 nm, a doping concentration No in the channel 119 of approximately $3*10^{18}$ cm$^{-3}$, and a 2×8 nm internal spacer, the relative conductance of the un-gated FinFET 118 is approximately 15% across a range of applied voltages. In one embodiment in which the un-gated FinFET 118 has a channel length (Lc) of approximately 30 nm, a doping concentration No in the channel 119 of approximately $6*10^{18}$ cm$^{-3}$, and a 4×8 nm internal spacer, the relative conductance of the un-gated FinFET 118 is approximately 8% across a range of applied voltages.

Figure 7:
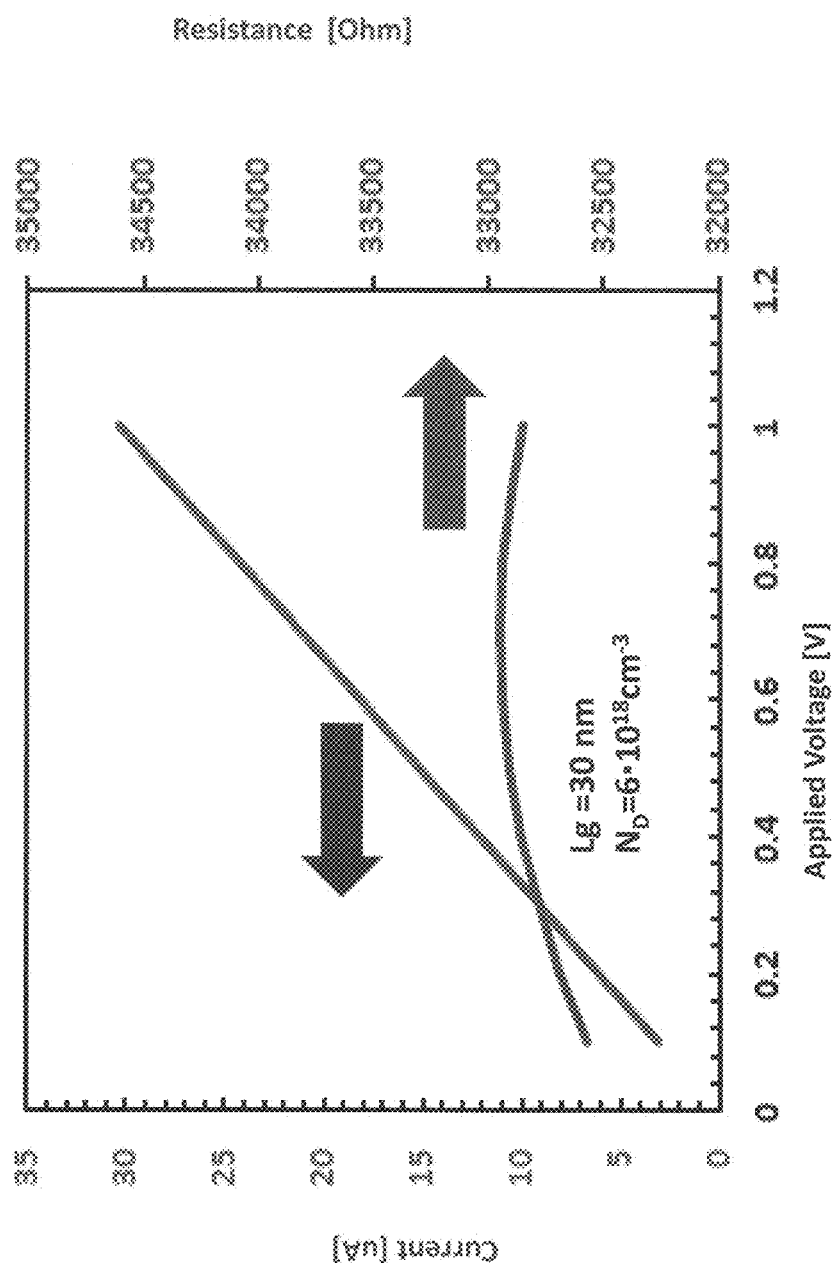
FIG. 7 is a graph depicting the current and resistance of a passive resistor according to one embodiment of the present disclosure as a function of the applied voltage.

FIG. 7 is a graph depicting the current and resistance of the un-gated FinFETs 118 of the passive resistors 101, 102 according to one embodiment of the present disclosure as a function of an applied voltage. As illustrated in FIG. 7, an un-gated FinFET 118 having a channel length (Lc) of approximately 30 nm and a doping concentration No in the channel 119 of approximately $6*10^{18}$ cm$^{-3}$ has a near linear variation of resistance as a function of the applied voltage ranging from approximately 0.1V to approximately 1.0V (i.e., a resistance non-linearity of approximately 3%).

In the "ON" state, the conductance of the FeFET gating transistors 103, 104 is not as high as the conductance of the embodiment of the gating transistors having standard logic FETs with an applied bias. This lower conductance is attributed to the zero applied gate bias to the FeFET gating transistors 103, 104. In one or more embodiments, to achieve suitable linearity of the overall weight (i.e., weights that are independent or substantially independent of an applied signal magnitude), the passive resistors 101, 102 (e.g., the un-gated FinFETS 118) each have a resistance from approximately 30 kΩ to approximately 50 kΩ, which is at least an order of magnitude larger than the resistance of the FeFET gating transistors 103, 104 in the "ON" state. Additionally, the FeFET gating transistors 103, 104 in the "OFF" have a resistance that is at least several orders of magnitude higher than the resistance of the passive resistors 101, 102 (e.g., the un-gated FinFETS 118), which effectively makes the weight of the neuromorphic cell 100 zero when the FeFET gating transistors 103, 104 are in the "OFF" state.

Capacitive coupling between the drain of the FeFET gating transistors 103, 104 and the floating node 116 connecting the FeCaps 110 to the gates 111 of the underlying FETs 109 is a detriment to the linearity of the OFF-state weights of the neuromorphic cell 100. In the "OFF" state, the voltage drop across the passive resistor 101, 102 is small, which places the full signal voltage across the FeFET gating transistor 103, 104. Due to the capacitive coupling to the floating node 116, the potential of the floating node 116 is increased, which increases the cutoff voltage ($V_{gs}$) across the FeFET gating transistor 103, 104. Increasing the cutoff voltage ($V_{gs}$) across the FeFET gating transistor 103, 104 leads to an increase in current for the OFF-state FeFET gating transistor 103, 104, which could eventually cause the weights to significantly depart from linearity. Accordingly, in one or more embodiments, the applied signal to the neuromorphic cell 100 may be limited to approximately 0.8V, which is compatible with the positive supply voltage ($V_{DD}$) of CPU cores in advanced CMOS nodes.

In one or more embodiments, the neuromorphic cells 100 of the present disclosure are immune or substantially immune to read disturb. Even though inference causes a small change in the FeCap 110 voltage, as described above, expected inference times are at most approximately 100 nanoseconds (ns) in duration, and likely only 10s of ns in duration. Due to the slow response of ferroelectric domains (e.g., 10s of microseconds (μs) for HfZrO$_2$ ferroelectric material), no switching of domains, and therefore no read disturb, would occur during inference.

With reference again now to the embodiment illustrated in FIG. 2A, the neuromorphic cell 100 also includes a selector line 123 connected to the programming input lines 107, 108. The neuromorphic cell 100 also includes selector transistors 124, 125 connected at junctions between the selector line 123 and the programming input lines 107, 108, respectively. Positioning the selector transistors 124, 125 at the inputs to the FeCaps 110 of the FeFET gating transistors 103, 104, respectively, is configured to provide immunity or substantial immunity to write disturb.

Although the present invention has been described with reference to the example embodiments, those skilled in the art will recognize that various changes and modifications to the described embodiments may be performed, all without departing from the spirit and scope of the present invention. Furthermore, those skilled in the various arts will recognize that the present invention described herein will suggest solutions to other tasks and adaptations for other applications. It is the applicant's intention to cover by the claims herein, all such uses of the present invention, and those changes and modifications which could be made to the example embodiments of the present invention herein chosen for the purpose of disclosure, all without departing from the spirit and scope of the present invention. Thus, the example embodiments of the present invention should be considered in all respects as illustrative and not restrictive, with the spirit and scope of the present invention being indicated by the appended claims, and their equivalents.

What is claimed is:

1. A neuromorphic multi-bit digital weight cell configured to store a plurality of potential weights for a neuron in an artificial neural network, the neuromorphic multi-bit digital weight cell comprising:
   a parallel cell comprising:
      a plurality of passive resistors in parallel; and
      a plurality of gating transistors, each gating transistor of the plurality of gating transistors being in series with one passive resistor of the plurality of passive resistors;
   a plurality of programming input lines connected to the plurality of gating transistors;
   an input terminal connected to the parallel cell; and
   an output terminal connected to the parallel cell, wherein at least one passive resistor of the plurality of passive resistors comprises an un-gated FinFET having an n-doped channel and n+ doped source and drain regions.

2. The neuromorphic weight cell of claim 1, wherein a first passive resistor of the plurality of passive resistors has a first resistance and a second passive resistor of the plurality of passive resistors has a second resistance, the second resistance being half the first resistance.

3. The neuromorphic weight cell of claim 2, wherein a third passive resistor of the plurality of passive resistors has a third resistance, the third resistance being half the second resistance.

4. The neuromorphic weight cell of claim 1, wherein the neuromorphic weight cell has a total conductance defined by $G_{tot}=\Sigma_{i=0} b_i 2^i G_0$, where $b_i$ is a Boolean value of bit i and $G_0$ is a smallest conductance in the neuromorphic weight cell.

5. The neuromorphic weight cell of claim 1, wherein neuromorphic weight cell is configured to generate a plurality of potential conductances uniformly distributed, and wherein the potential weights are proportional to the potential conductances.

6. The neuromorphic weight cell of claim 1, wherein a doping concentration of the ungated FinFET is between approximately $10^{18}$ cm$^{-3}$ and approximately $10^{19}$ cm$^{-3}$, and wherein the un-gated FinFETs is doped with As or P doping.

7. The neuromorphic weight cell of claim 1, wherein a channel length of the un-gated FinFET is approximately 30 nm, and wherein a doping concentration of the un-gated FinFET is approximately $6*10^{18}$ cm$^{-3}$.

8. The neuromorphic weight cell of claim 1, wherein an overall length of the un-gated FinFET spans more than one contacted poly pitch (CPP).

9. The neuromorphic weight cell of claim 8, wherein the at least one passive resistor of the plurality of passive resistors comprises a plurality of un-gated FinFETs.

10. The neuromorphic weight cell of claim 1, wherein each gating transistor of the plurality of gating transistors is a standard core logic transistor.

11. The neuromorphic weight cell of claim 10, wherein the standard core logic transistor is a FinFET or a gate-all-around field effect transistor (GAA FET).

12. The neuromorphic weight cell of claim 1, wherein each gating transistor of the plurality of gating transistors is a ferroelectric FET (FeFET), the FeFET comprising a ferroelectric capacitor (FeCap) and an underlying FET, wherein the FeCap is connected to a gate of the underlying FET.

13. The neuromorphic weight cell of claim 12, wherein the FeCap comprises a pair of titanium nitride (TiN) electrodes and a hafnium zirconium oxide (HfZrO$_2$) ferroelectric layer between the pair of TiN electrodes.

14. The neuromorphic weight cell of claim 12, wherein the FeCap of each FeFET is at a metal layer in a back-end-of-line of the neuromorphic weight cell.

15. The neuromorphic weight cell of claim 14, wherein the metal layer is lowermost metal routing layer M0.

16. The neuromorphic weight cell of claim 12, wherein the FeCap of each FeFET is at an insulating layer in a back-end-of-line of the neuromorphic weight cell.

17. The neuromorphic weight cell of claim 16, wherein the insulating layer is lowermost insulating layer V0.

18. The neuromorphic weight cell of claim 1, further comprising:
a selector line connected to the plurality of programming input lines; and
a plurality of selector transistors at junctions between the selector line and the plurality of programming input lines.

* * * * *